(12) United States Patent
Hong et al.

(10) Patent No.: US 8,676,374 B2
(45) Date of Patent: Mar. 18, 2014

(54) SUBSTRATE-PROCESSING APPARATUS AND METHOD OF TRANSFERRING SUBSTRATE IN THE SAME

(75) Inventors: Sang-Seok Hong, Chungcheongnam-do (KR); Hyun-Woo Kim, Chungcheongnam-do (KR)

(73) Assignee: Semes Co., Ltd., Chungcheongnam-do (KR)

( * ) Notice: Subject to any disclaimer, the term of this patent is extended or adjusted under 35 U.S.C. 154(b) by 494 days.

(21) Appl. No.: 13/056,413

(22) PCT Filed: Apr. 6, 2009

(86) PCT No.: PCT/KR2009/001747
§ 371 (c)(1),
(2), (4) Date: Apr. 14, 2011

(87) PCT Pub. No.: WO2010/016649
PCT Pub. Date: Feb. 11, 2010

(65) Prior Publication Data
US 2011/0264260 A1 Oct. 27, 2011

(30) Foreign Application Priority Data
Aug. 6, 2008 (KR) .......................... 10-2008-0077106

(51) Int. Cl.
*G06F 7/00* (2006.01)
(52) U.S. Cl.
USPC .......................................................... 700/218
(58) Field of Classification Search
USPC .................................. 700/218, 214, 213, 112
See application file for complete search history.

(56) References Cited

U.S. PATENT DOCUMENTS

2007/0265714 A1* 11/2007 Takakura ........................ 700/45
2011/0153062 A1* 6/2011 Hong et al. .................... 700/218

FOREIGN PATENT DOCUMENTS

| JP | 11-312726 A | 11/1999 |
|---|---|---|
| JP | 2003-309159 A | 10/2003 |
| JP | 2006-073835 A | 3/2006 |
| JP | 2008108790 A | 5/2008 |
| KR | 1020060030254 A | 4/2006 |

OTHER PUBLICATIONS

International Search Report for Appl. No. PCT/KR2009/001747 mailed Nov. 20, 2009.

* cited by examiner

*Primary Examiner* — Ramya Burgess
(74) *Attorney, Agent, or Firm* — Carter, DeLuca, Farrell & Schmidt, LLP

(57) ABSTRACT

Provided is a substrate-processing apparatus including a transfer member loading and taking out a substrate to and from a storage member, and a control unit controlling the transfer member. The transfer member includes a plurality of transfer arms and an arm-driving part moving the respective transfer arms horizontally, and substrates are loaded on the respective transfer arms. The control unit controls a movement velocity and a position of the transfer member and compares movement velocity profiles of the transfer arms, so as to control movement velocities of the respective transfer arms. Accordingly, the simultaneously driven transfer arms simultaneously arrive at target points, and thus the substrate-processing apparatus reduces transfer time and improves productivity.

7 Claims, 5 Drawing Sheets

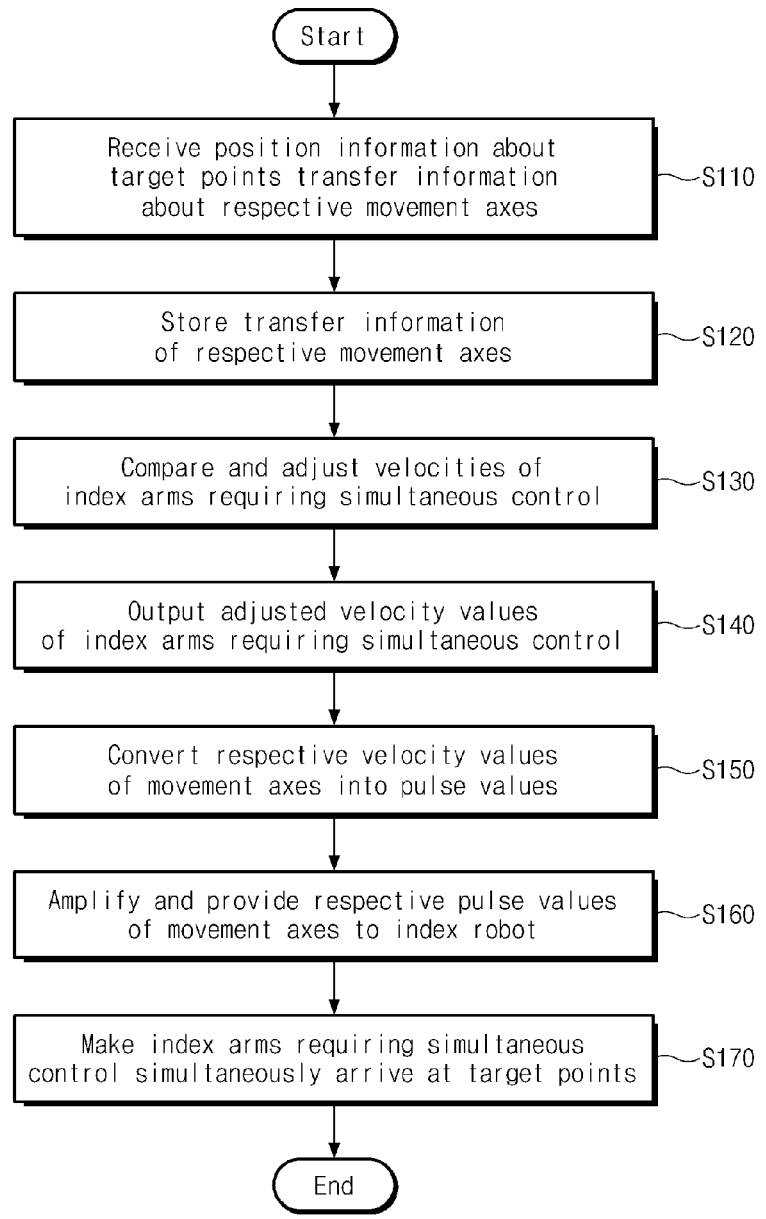

SUBSTRATE-PROCESSING APPARATUS AND METHOD OF TRANSFERRING SUBSTRATE IN THE SAME

TECHNICAL FIELD

The present invention disclosed herein relates to an apparatus manufacturing a semi-conductor substrate, and more particularly, to a substrate-processing apparatus processing a semiconductor substrate and a method of transferring the substrate in the substrate-processing apparatus.

BACKGROUND ART

In substrate-manufacturing processes, deposition and etching of dielectrics and metal materials, coating and development of photoresists, asher process, etc are repeated a plurality of times to achieve delicate arrangement of patterning. However, although these processes including the etching or the asher process are performed, foreign substances still remain in substrates. Processes for removing these foreign substances include a cleaning process using deionized water or chemical.

Substrate-cleaning apparatuses performing the cleaning process are classified into a batch substrate cleaning apparatus and a single substrate dealing apparatus. The batch substrate cleaning apparatus includes a chemical bath, a rinse bath, and a dry bath having sizes capable of processing 25 substrates or 50 substrates at once. The batch substrate cleaning apparatus removes foreign substances by immersing substrates in the respective baths for predetermined times. Such a batch substrate cleaning apparatus simultaneously cleans upper and lower portions of a substrate and processes a large amount of substrates simultaneously. However, as the diameters of substrates are increased, the sizes of baths are also increased, so as to increase the size of an apparatus and the amount of chemical. In addition, foreign substances detached from adjacent substrates are attached to substrates being cleaned in a chemical bath.

Recently, as the diameter of substrates is increased, the single substrate cleaning apparatus is widely used. In the single substrate cleaning apparatus, a substrate is fixed to a substrate chuck in a chamber having a small size adapted for processing a single substrate, then rotated by a motor, and then chemical or deionized water is provided to the substrate through a nozzle disposed over the substrate. The spin of the substrate spreads the chemical or the deionized water on the upper portion of the substrate, so as to remove foreign substances from the substrate. The single substrate cleaning apparatus has a smaller size than the batch substrate cleaning apparatus and achieves a uniform cleaning performance.

In general, the single substrate cleaning apparatus includes, from a side thereof, a loading/unloading unit, an index robot, a buffer unit, process chambers, and a main transfer robot. The index robot transfers substrates between the buffer unit and the loading/unloading unit, and the main transfer robot transfers substrates between the buffer unit and the process chambers. At the buffer unit, substrates to be cleaned wait to be inserted into the process chambers, or the substrates that have been cleaned wait to be transferred to the loading/unloading unit.

A transfer robot such as the index robot and the main transfer robot includes a plurality of arms, and a substrate is loaded on each of the arms. The respective arms move horizontally to take out or load substrates from or to storage such as front open unified pods (FOUPs) or the buffer unit.

Such the transfer robot's arms are driven independently, and thus the respective arms have separate horizontal driving shafts, and assembling tolerance occurs between the arms. Accordingly, when driving at least two arms together, velocities of the respective arms are different, so that time points when the respective arms arrive at target points are different. As such, when simultaneously driving the arms of the transfer robot, the time points when the arms arrive at the target point are different, and thus it is difficult to simultaneously take out a plurality of substrates from a storage device.

DISCLOSURE OF INVENTION

Technical Problem

The present invention provides a substrate-processing apparatus improving efficiency in loading and unloading a substrate.

The present invention also provides a method of transferring a substrate in the substrate-processing apparatus.

Technical Solution

Embodiments of the present invention provide substrate-processing apparatuses including a storage member, a transfer member, and a control unit.

The storage member arranges a plurality of substrates in a vertical direction to store the substrates. The transfer member includes a plurality of transfer arms facing each other in the vertical direction, and an arm-driving part disposed under the transfer arms and coupled to the transfer arms and moving the respective transfer arms horizontally, and the substrates are loaded on the respective transfer arms, and the transfer member takes out and loads at least one substrate from and to the storage member. The control unit controls a movement velocity and a position of the transfer member and controls the arm-driving part such that at least two of the transfer arms simultaneously arrive at target points in the storage member, and the control unit compares expectation velocity profiles corresponding to the target points of the respective transfer arms to be simultaneously controlled, so as to control movement velocities of the respective transfer arms.

In some embodiments, the transfer member may further include a rotation part, a vertical movement part, and a horizontal movement part. The rotation part is disposed under the arm-driving part and coupled to the arm-driving part and rotates the arm-driving part. The vertical movement part is disposed under the rotation part and coupled to the rotation part and moves the rotation part upward and downward to adjust vertical positions of the transfer arms. The horizontal movement part is disposed under the vertical movement part and coupled to the vertical movement part and moves horizontally to adjust a horizontal position of the transfer member.

In other embodiments, the control unit may include an input process part, a comparison operation part, an output control part, a motion card, and a driving unit. The input process part receives and outputs velocity information including respective velocity values of the transfer arms, the rotation part, the vertical movement part, and the horizontal movement part, and position information about the respective target points of the transfer arms. The comparison operation part calculates the expectation velocity profiles of the respective transfer arms based on the velocity information and the position information received from the input process part and compares the expectation velocity profiles of the transfer arms with a preset reference profile to reset the respective velocity values corresponding to the index arms and outputs the reset velocity values. The output control part outputs the velocity values of the transfer arms output from the comparison operation part, and the respective velocity values corresponding to the rotation part, the vertical movement part, and the horizontal movement part. The motion card converts the respective velocity values corresponding to the transfer arms, the rotation part, the vertical movement part, and the horizontal movement part and output from the output control part, into pulse values, respectively, and outputs the converted pulse values. The driving unit amplifies the pulse values outputted from the motion card and provides the amplified pulse values to the transfer member.

In other embodiments of the present invention, methods of transferring a substrate include: receiving transfer information including respective velocity values of movement axes of a transfer member transferring substrates, and position information about target points in a storage member where the transfer member taking out or loading the substrates; comparing expectation velocity profiles of transfer arms of the transfer member to reset respective velocity values of the transfer arms such that the transfer arms horizontally move and respectively arrive at the corresponding target points at a same time point; outputting the reset velocity values and the respective velocity values of the movement axes of the transfer member except for the transfer arms; converting the output velocity values into pulse values; after amplifying the pulse values and providing the amplified pulse values to the transfer member; and after horizontally moving the transfer arms to the corresponding target points according to the reset velocity values and making the transfer arms simultaneously arrive at the corresponding target points, simultaneously loading or taking out the substrates to or from the storage member.

Advantageous Effects

According to the present invention, the substrate-processing apparatus includes the control part adjusting the velocities of the transfer arms, and controls the simultaneously driven transfer arms to simultaneously arrive at the target points. Accordingly, the transfer member loads or takes out a plurality of substrates to or from the storage member at once, so that the substrate-processing apparatus reduces the transfer time and improves the productivity.

BRIEF DESCRIPTION OF DRAWINGS

The accompanying figures are included to provide a further understanding of the present invention, and are incorporated in and constitute a part of this specification. The drawings illustrate exemplary embodiments of the present invention and, together with the description, serve to explain principles of the present invention. In the figures:

FIG. 6 is a flowchart illustrating a process that the first control unit illustrated in FIG. 5 controls the horizontal movements of index arms.

MODE FOR THE INVENTION

Preferred embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art.

Hereinafter, it will be described about an exemplary embodiment of the present invention in conjunction with the accompanying drawings.

Figure 1:
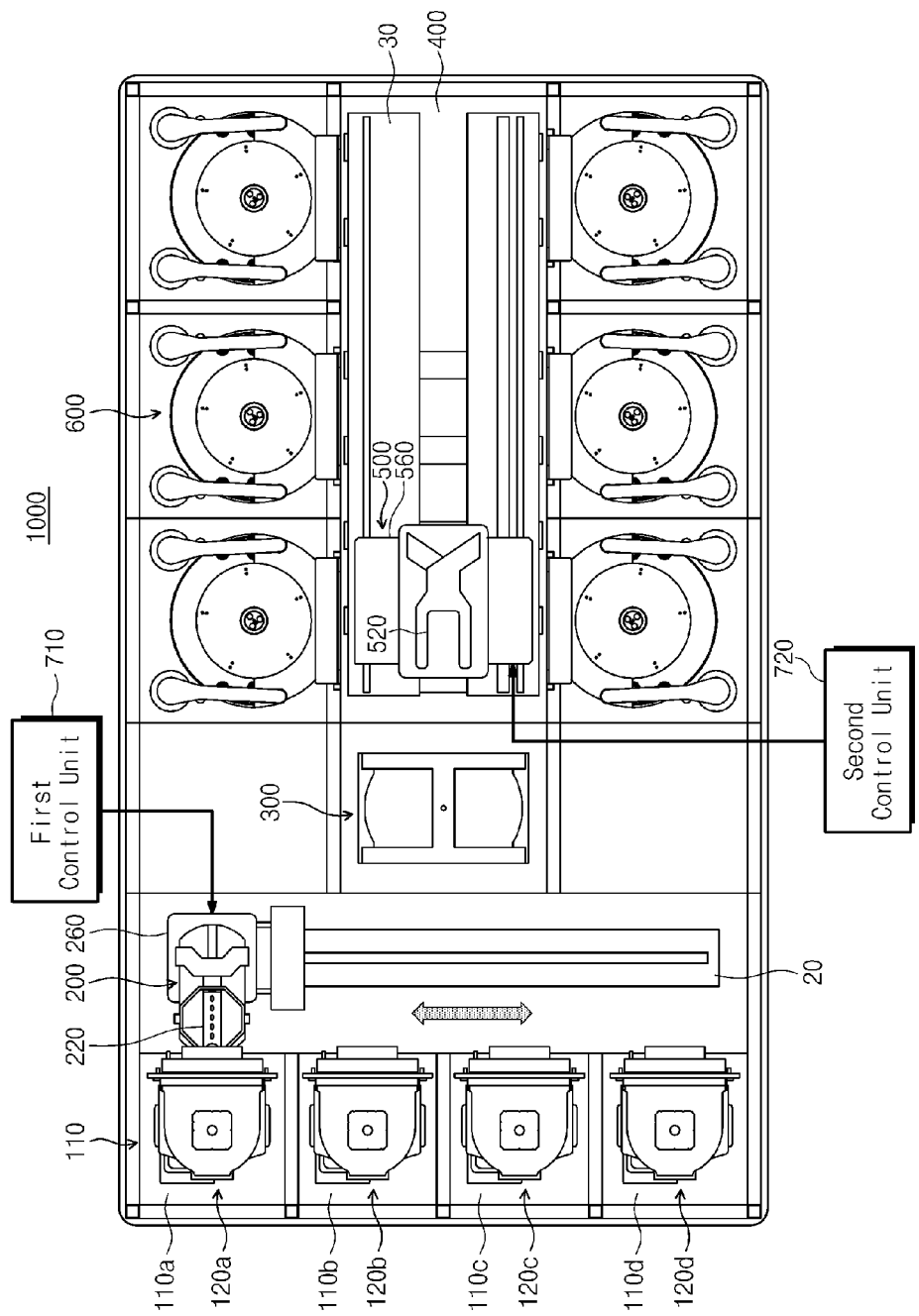
FIG. 1 is a schematic view illustrating a substrate-processing system according to an embodiment of the present invention.
Figure 2:
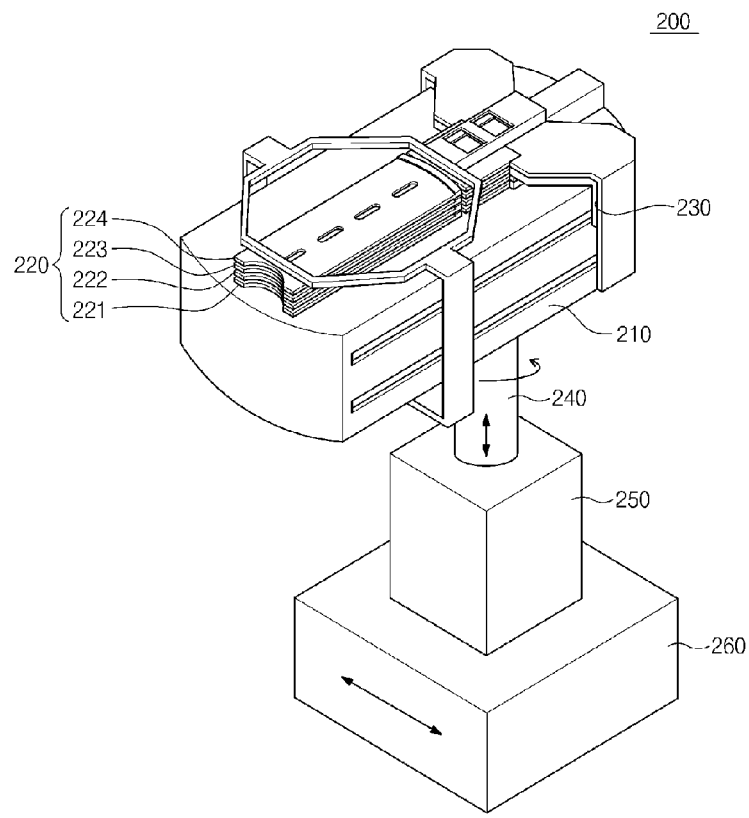
FIG. 2 is a perspective view illustrating an index robot illustrated in FIG. 1.

FIG. 1 is a schematic view illustrating a substrate-processing system 1000 according to an embodiment of the present invention, and FIG. 2 is a perspective view illustrating an index robot 200 illustrated in FIG. 1.

Referring to FIGS. 1 and 2, the substrate-processing system 1000 may include a loading/unloading unit 110, the index robot 200, a buffer unit 300, a main transfer robot 500, a plurality of process chambers 600, and first and second control units 710 and 720.

The loading/unloading unit 110 includes a plurality of load ports 110a, 110b, 110c, and 110d. Although the loading/unloading unit 110 includes the four load ports 110a, 110b, 110c, and 110d in this embodiment, the number of the load ports 110a, 110b, 110c, and 110d may be increased or decreased according to process efficiency and footprint conditions of the substrate-processing system 1000.

Front open unified pods (FOUPs) 120a, 120b, 120c, and 120d are placed on the load ports 110a, 110b, 110c, and 110d. Wafers are stored in the FOUPs 120a, 120b, 120c, and 120d. The respective FOUPs 120a, 120b, 120c, and 120d are provided with a plurality of slots for storing wafers horizontally to a ground. The FOUPs 120a, 120b, 120c, and 120d store wafers that was loaded and have been processed in the process chamber 600 or wafers that will be loaded and processed in the process chamber 600. Hereinafter, for convenience, wafers that have been processed by the substrate-processing system 1000 are referred to as processed wafers, and wafers that are not processed yet are referred to as primitive wafers.

The index robot 200 is disposed between the loading/unloading unit 110 and the buffer unit 300, and a first transfer rail 20 is disposed below the index robot 200. The index robot 200 moves along the first transfer rail 20 and transfers wafers. The index robot 200 may include an arm-driving part 210, an index arm part 220, a plurality of connection parts 230, a rotation part 240, a vertical movement part 250, and a horizontal movement part 260.

Particularly, the arm-driving part 210 moves respective index arms 221, 222, 223, and 224 horizontally. The index arms 221, 222, 223, and 224 are separately driven by the arm-driving part 210.

An upper portion of the arm-driving part 210 is provided with the index arm part 220. The index arms 221, 222, 223, and 224 face each other in the vertical direction, and a wafer is loaded on each of the index arms 221, 222, 223, and 224. In this embodiment, the index robot 200 is provided with the four index arms 221, 222, 223, and 224, but the number of the index arms 221, 222, 223, and 224 may be increased or decreased according to the process efficiency of the substrate-processing system 1000.

The index arms 221 and 222 transferring primitive wafers may be referred to as load index arms, and the index arms 223 and 224 transferring processed wafers may be referred to as unload index arms. In this case, the load index arms 221 and 222 and the unload index arms 223 and 224 are disposed separately, not alternately. For example, the unload index arms 223 and 224 may be disposed over the load index arms 221 and 222. Accordingly, the index robot 200 prevents processed wafers from being contaminated by primitive wafers while transferring the primitive wafers and the processed wafers, thereby improving the yield of products.

The load index arms 221 and 222 placed on the loading/unloading unit 110 take out primitive wafers from any one of the waiting FOUPs 120*a*, 120*b*, 120*c*, and 120*d* and then load the primitive wafers to the buffer unit 300. The index robot 200 takes out at least one primitive wafer at once from the waiting FOUPs 120*a*, 120*b*, 120*c*, and 120*d*. That is, the load index arms 221 and 222 may simultaneously insert primitive wafers to the process-waiting FOUPs 120*a*, 120*b*, 120*c*, and 120*d* and then simultaneously take out the primitive wafers. Thus, two primitive wafers may be simultaneously taken out from the process-waiting FOUPs 120*a*, 120*b*, 120*c*, and 120*d*.

Also, the index robot 200 loads at least one primitive wafer to the buffer unit 300. That is, the load index arms 221 and 222 may be simultaneously inserted to the buffer unit 300 and then simultaneously load primitive wafers thereon to the buffer unit 300. Thus, two primitive wafers may be simultaneously loaded on the buffer unit 300.

For example, the maximum number of wafers taken out by the index robot 200 at once from the process-waiting FOUPs 120*a*, 120*b*, 120*c*, and 120*d* and the maximum number of wafers loaded at once to the buffer unit 300 are equal to the number of the load index arms 221 and 222.

The unload index arms 223 and 224 unload processed wafers from the buffer unit 300 and load the processed wafers to the index robot 200. The index robot 200 unloads at least one processed wafer at once from the buffer unit 300. That is, the unload index arms 223 and 224 may be simultaneously inserted to the buffer unit 300 and then simultaneously unload primitive wafers from the buffer unit 300. Thus, two primitive wafers may be simultaneously taken out from the buffer unit 300.

Also, the index robot 200 loads at least one processed wafer at once to the process-waiting FOUPs 120*a*, 120*b*, 120*c*, and 120*d* again. That is, the unload index arms 223 and 224 are simultaneously inserted into the process-waiting FOUPs 120*a*, 120*b*, 120*c*, and 120*d*, and then simultaneously load processed wafers placed thereon to the process-waiting FOUPs 120*a*, 120*b*, 120*c*, and 120*d*. Thus, two processed wafers are simultaneously loaded to the process-waiting FOUPs 120*a*, 120*b*, 120*c*, and 120*d*.

For example, the maximum number of wafers taken out by the index robot 200 at once from the buffer unit 300 and the maximum number of wafers loaded at once to the FOUPs 120*a*, 120*b*, 120*c*, and 120*d* are equal to the number of the unload index arms 223 and 224.

As such, the index robot 200 takes out and loads a plurality of wafers at once from and to the FOUPs 120*a*, 120*b*, 120*c*, and 120*d* and the buffer unit 300, thereby reducing time for transferring wafers and improving productivity.

The index arm part 220 is connected to the connection parts 230. The connection parts 230 are coupled to the arm-driving part 210 to move horizontally the connected index arms 221, 222, 223, and 224 according to driving of the arm-driving part 210.

The rotation part 240 is disposed below the arm-driving part 210. The rotation part 240 is coupled to the arm-driving part 210 and rotates to rotate the arm-driving part 210. Accordingly, the index arm part 220 is also rotated.

The vertical movement part 250 is disposed under the rotation part 240, and the horizontal movement part 260 is disposed under the vertical movement part 250. The vertical movement part 250 is coupled to the rotation part 240 to move the rotation part 240 upward and downward, and thus, vertical positions of the arm-driving part 210 and the index arm part 220 are adjusted. The horizontal movement part 260 is coupled to the first transfer rail 20 and moves horizontally along the first transfer rail 20. Accordingly, the index robot 200 moves along an arrangement direction of the load ports 110*a*, 110*b*, 110*c*, and 110*d*.

The buffer unit 300 is disposed between a region where the index robot 200 is disposed and a region where the process chambers 600 and the main transfer robot 500 are disposed. The buffer unit 300 receives primitive wafers transferred by the index robot 200, and wafers processed at the process chambers 600.

Figure 3:
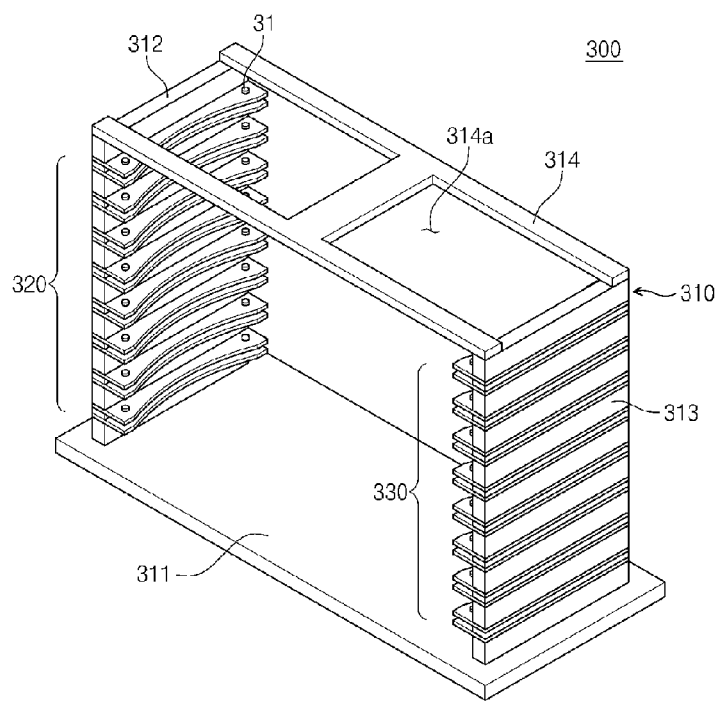
FIG. 3 is a perspective view of a buffer unit illustrated in FIG. 1.

FIG. 3 is a perspective view of the buffer unit 300 illustrated in FIG. 1.

Referring to FIGS. 1 and 3, the buffer unit 300 includes a main body 310 and first and second support parts 320 and 330.

Particularly, the main body 310 may include a bottom surface 311, first and second sidewalls 312 and 313 extending vertically from the bottom surface 311, and an upper surface 314 coupled to upper ends of the first and second sidewalls 312 and 313.

For accessing with wafers, the main body 310 has an open front wall facing the index robot 200 and an open rear wall facing the main transfer robot 500. Accordingly, it is convenient for the index robot 200 and the main transfer robot 500 to insert and take out wafers into and from the buffer unit 300.

The first and second sidewalls 312 and 313 face each other, and the upper surface 314 is partially removed to have an opening 314*a*.

The first and second support parts 320 and 330 are disposed in the main body 310. The first support part 320 is coupled to the first sidewall 312, and the second support part 330 is coupled to the second sidewall 313. Each of the first and second support parts 320 and 330 includes a plurality of supports. The supports of the first support part 320 are in one-to-one correspondence to the supports of the second support part 330. Wafers are received by the buffer unit 300 with ends of the wafers supported by the supports of the first support part 320 and the supports of the second support part 330, in which the wafers face the bottom surface 311.

The supports of the first support part 320 are placed apart from each other in the vertical direction, the supports of the second support part 320 are placed apart from each other in the vertical direction. Particularly, the supports of the first support part 320 are spaced a first gap from each other in the vertical direction by the number of the load index arms 221 and 222 (refer to FIG. 4) and the number of the unload index arms 223 and 224 (refer to FIG. 4). The supports of the second support part 330 are spaced the first gap from each other in the vertical direction by the number of the load index arms 221 and 222 (refer to FIG. 4) and the number of the unload index arms 223 and 224 (refer to FIG. 4). The load index arms 221 and 222 and the unload index arms 223 and 224 are also spaced the first gap, respectively. Accordingly, the index robot 200 takes out and loads a plurality of wafers at once from and into the buffer unit 300. Here, the first gap is equal to a slot gap of the FOUPs 120*a*, 120*b*, 120*c*, and 120*d*.

The respective supports of the first and second support parts 320 and 330 may be provided with guide parts 31 guiding the positions of wafers. The guide parts 31 protrude from top surfaces of the support and support side surfaces of wafers.

As described above, the gaps between the supports of the buffer unit 300, disposed sequentially are the same as those between the index arms 221, 222, 223, and 224 that simultaneously pick up or load wafers. Accordingly, the index robot 200 takes out and loads a plurality of wafers at once from and to the buffer unit 300, thereby improving workability and productivity and reducing process time.

The main transfer robot 500 transfers primitive wafers disposed in the buffer unit 300 to the respective process chambers 600. The main transfer robot 500 is disposed at a transfer passage 400, and moves along a second transfer rail 30 disposed at the transfer passage 400. The transfer passage 400 is connected to the process chambers 600.

The main transfer robot 500 picks up primitive wafers from the buffer unit 300, and then moves along the second transfer rail 30. Then, the main transfer robot 500 provides the primitive wafers to the relevant one of the process chambers 600. Also, the main transfer robot 500 loads wafers processed in the process chambers 600 to the buffer unit 300.

Figure 4:
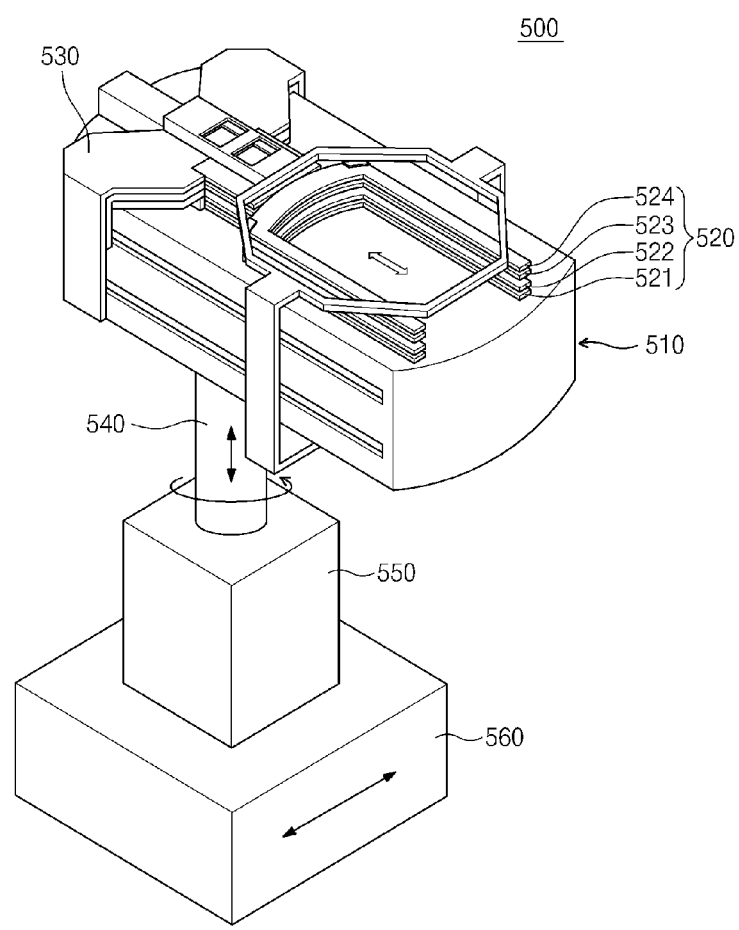
FIG. 4 is a perspective view of a main transfer robot illustrated in FIG. 1.

FIG. 4 is a perspective view of the main transfer robot 500 illustrated in FIG. 1.

Referring to FIGS. 1 and 4, the main transfer robot 500 may include a hand-driving part 510, a pick-up hand part 520, a plurality of connection parts 530, a rotation part 540, a vertical movement part 550, and a horizontal movement part 560.

Particularly, the hand-driving part 510 moves respective pick up hands 521, 522, 523, and 524 horizontally. The respective pick up hands 521, 522, 523, and 524 are independently driven by the hand-driving part 510.

An upper portion of the hand-driving part 510 is provided with the pick-up hand part 520. The pick-up hands 521, 522, 523, and 524 face each other in the vertical direction, and a wafer is loaded on each of the pick-up hands 521, 522, 523, and 524. In this embodiment, the main transfer robot 500 is provided with the four pick-up hands 521, 522, 523, and 524, but the number of the pick-up hands 521, 522, 523, and 524 may be increased or decreased according to the process efficiency of the substrate-processing system 1000.

The pick-up hands 521 and 522 transferring primitive wafers may be referred to as load pick-up hands, and the pick-up hands 523 and 524 transferring processed wafers may be referred to as unload pick-up hands. In this case, the load pick-up hands 521 and 522 and the unload pick-up hands 523 and 524 are disposed separately, not alternately. For example, the unload pick-up hands 523 and 524 may be disposed on the load pick-up hands 521 and 522. Accordingly, the main transfer robot 500 prevents processed wafers from being contaminated by primitive wafers while transferring the primitive wafers and the processed wafers, thereby improving the yield of products.

The respective load pick-up hands 521 and 522 take out the primitive wafers from the buffer unit 300 and provide the processed wafers to the unemployed one of the process chambers 600. The load pick-up hands 521 and 522 are spaced the first gap of the respective supports of the buffer unit 300. Thus, the load pick-up hands 521 and 522 can take out simultaneously the primitive wafers from the buffer unit 300.

The respective unload pick-up hands 523 and 524 take out processed wafers from the process chamber 600 that have completed a process and then load the processed wafers to the buffer unit 300. The unload pick-up hands 523 and 524 are spaced the first gap. Thus, the unload pick-up hands 523 and 524 can simultaneously load the processed wafers taken out from the process chambers 600, to the buffer unit 300.

In this embodiment, the number of the load pick-up hands 521 and 522 and the number of the unload pick-up hands 523 and 524 are two, respectively, but the numbers may be increased or decreased according to the process efficiency of the substrate-processing system 1000.

For example, the number of the supports in the buffer unit 300, spaced the first gap and disposed sequentially, and the maximum number of the index arms 221, 222, 223, and 224 in the index robot 200, taking out or loading wafers from or to the buffer unit 300 at once, and the maximum number of the pick-up hands 521, 522, 523, and 524 in the main transfer robot 500, taking out or loading wafers from or to the buffer unit 300 at once are the same.

As such, the main transfer robot 500 takes out a plurality of primitive wafers or one primitive wafer at once from the buffer unit 300. Also, the main transfer robot 500 loads a plurality of processed wafers or one processed wafer at once to the buffer unit 300. Accordingly, since a transfer time of wafers is reduced, the substrate-processing system 1000 can reduce the process time and improve the productivity.

The pick-up hands 521, 522, 523, and 524 are connected to the connection parts 530. The connection parts 530 coupled to the hand-driving part 510 horizontally move the connected pick-up hands 521, 522, 523, and 524 according to driving of the hand-driving part 510.

The rotation part 540 is disposed under the hand-driving part 510. The rotation part 540 is coupled to the hand-driving part 510 and rotates to rotate the hand-driving part 510. Accordingly, the pick-up hands 521, 522, 523, and 524 rotate together.

The vertical movement part 550 is disposed under the rotation part 540, and the horizontal movement part 560 is disposed under the vertical movement part 550. The vertical movement part 550 is coupled to the rotation part 540 and moves the rotation part 540 upward and downward, so as to adjust vertical positions of the hand-driving part 510 and the pick-up hand part 520. The horizontal movement part 560 is coupled to the second transfer rail 30 and moves along the second transfer rail 30. Accordingly, the main transfer robot 500 moves between the buffer unit 300 and the process chambers 600.

Both sides of the transfer passage 400 where the main transfer robot 500 is disposed are provided with the respective process chambers 600 processing primitive wafers and forming processed wafers. Processes performed in the process chambers 600 include a cleaning process for cleaning primitive wafers. Each two of the process chambers 600 face each other and the transfer passage 400 is disposed between the two process chambers 600. The three process chambers are disposed on each of the both sides of the transfer passage 400.

Although the substrate-processing system 1000 includes the six process chambers 600 in this embodiment, the number of the process chambers 600 may be increased or decreased according to the process efficiency and the footprint conditions of the substrate-processing system 1000. Also, although the process chambers 600 are disposed in a single layer structure in this embodiment, twelve process chambers may be classified into two six-process-chamber groups in a multi-layer structure.

The index robot 200 is connected to the first control unit 710, and the main transfer robot 500 is connected to the second control unit 720. The first control unit 710 controls positions of the index robot 200, and the second control unit 720 controls positions of the main transfer robot 500.

Since the first and second control units 710 and 720 have the same configuration in this embodiment, the first control unit 710 is exemplified to describe the configuration of the first and second control units 710 and 720.

Figure 5:
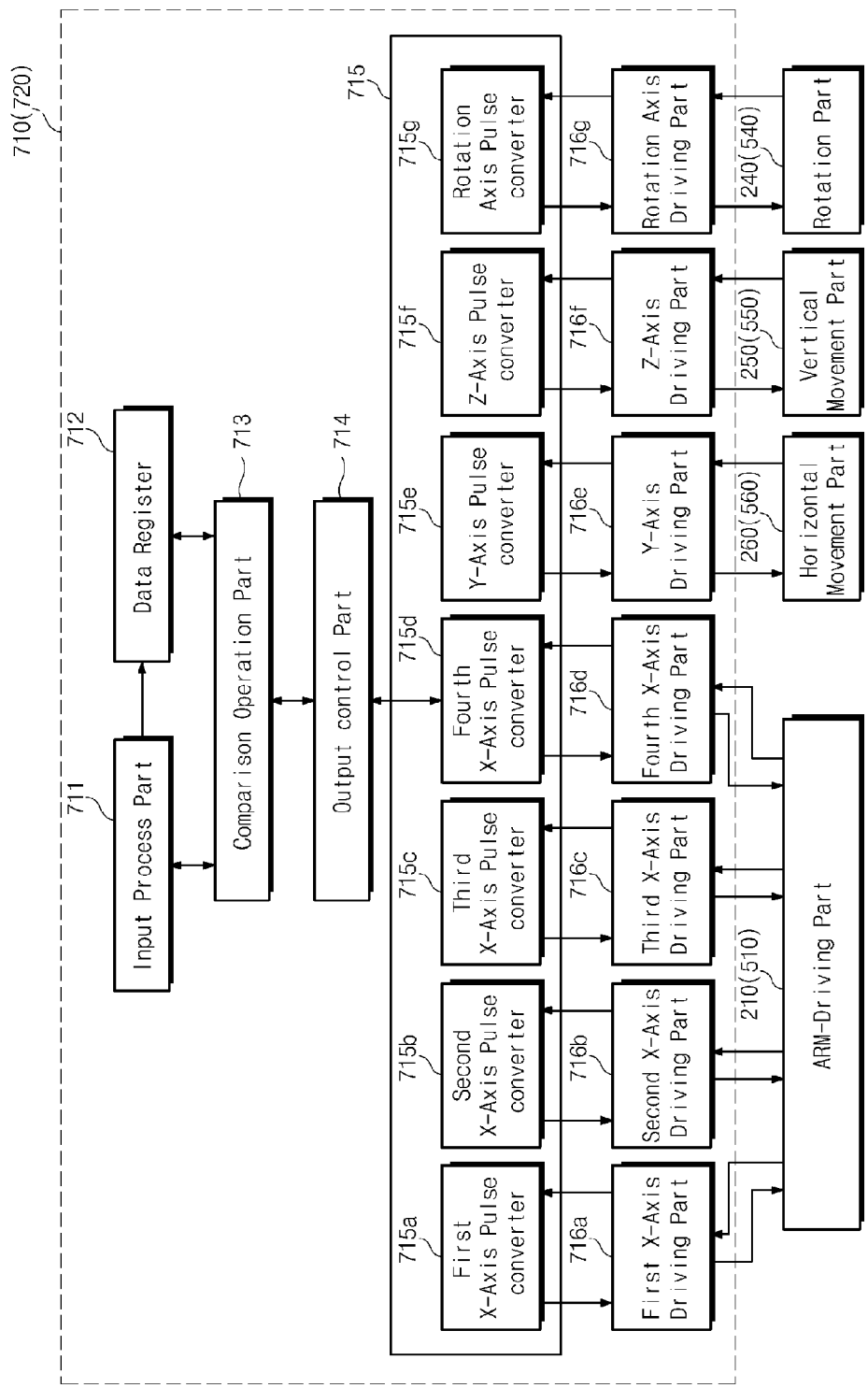
FIG. 5 is a block diagram illustrating the configuration of a first control unit illustrated in FIG. 1.

FIG. 5 is a block diagram illustrating the configuration of the first control unit 710 illustrated in FIG. 1. Referring to FIGS. 2 and 5, the first control unit 710 may include an input process part 711, a data register 712, a comparison operation part 713, an output control part 714, a motion card 715, first through fourth x-axis driving parts 716a, 716b, 716c, and 716d, a y-axis driving part 716e, a z-axis driving part 716f, and a rotation axis driving part 716g.

Particularly, the input process part 711 receives position information about target points of the respective index arms 221, 222, 223, and 224, and transfer information of respective movement axes of the index robot 200, that is, velocity information about transfer velocities of the respective index arms 221, 222, 223, and 224, the rotation part 240, the vertical movement part 250, and the horizontal movement part 260. The movement axes of the index robot 200 include a rotation axis corresponding to the rotation part 240, a z-axis corresponding to the vertical movement part 250, first through fourth x-axes corresponding to the index arms 221, 222, 223, and 224, and a y-axis corresponding to the horizontal movement part 260.

The input process part 711 provides the position informations and the velocity information that are received from an outside, to the data register 712 and the comparison operation part 713. The velocity information may include values of the maximum acceleration, the maximum deceleration and the maximum constant velocity of the respective index arms 221, 222, 223, and 224.

The position information and the velocity information received from the input process part 711 are stored in a designated register by the data register 712.

Based on the velocity information and the position information, the comparison operation part 713 calculates expectation velocity profiles predicting the respective index arms 221, 222, 223, and 224 traveling from start points to the target points. Each expectation velocity profile previously show variation in movement velocity from start time point when the corresponding one of the index arms 221, 222, 223, and 224 starts to move horizontally, to target time point when the corresponding index arm arrive at the corresponding target point.

For example, the index arms 221, 222, 223, and 224 each is accelerated from the start time point to a time point when reaching the maximum velocity that is preset, and is in uniform motion for a preset time from the time point when reaching the maximum velocity, and then is decelerated until arriving at the target point. Accordingly, the velocity profiles of the respective index arms 221, 222, 223, and 224 are displayed as trapezoidal graphs. Time during which the index arms 221, 222, 223, and 224 are decelerated may be equal to time during which the index arms 221, 222, 223, and 224 are accelerated.

The comparison operation part 713 respectively compares the expectation velocity profiles of the index arms 221, 222, 223, and 224 with a reference profile, and then respectively carries out an operation the expectation velocity profiles of the index arms 221, 222, 223, and 224 with the reference profile to adjust the velocity values of the index arms 221, 222, 223, and 224 such that at least two of the index arms 221, 222, 223, and 224 arrive the respective target points at the same time point. Thus, velocity values the index arms 221, 222, 223, and 224 are reset, so that the velocity profiles of corresponding ones of the index arms 221, 222, 223, and 224 are reset. As a result, when at least two of the index arms 221, 222, 223, and 224 are simultaneously driven, the corresponding ones of the index arms 221, 222, 223, and 224 arrive at the corresponding target points at the same time point.

The reference profile may be any one of the expectation velocity profiles of the index arms 221, 222, 223, and 224, or a preset velocity profile. For example, the reference profile may be any one of the expectation velocity profiles of the index arms 221, 222, 223, and 224, which has the longest expectation consumption time for arriving at the target point.

The comparison operation part 713 outputs the adjusted velocity profiles of the respective reset index arms 221, 222, 223, and 224 to the output control part 714.

The output control part 714 outputs the velocity values for the index arms 221, 222, 223, and 224 to arrive at the target points based on the velocity profiles output from the comparison operation part 713, to the motion card 715. The output control part 714 also outputs respective velocity values of the rotation part 240, the vertical movement part 250 and the horizontal movement part 260, to the motion card 715, so that the rotation part 240, the vertical movement part 250, and the horizontal movement part 260 arrive at corresponding target points.

The motion card 715 includes first, second, third and fourth x-axis pulse converters 715a, 715b, 715c, and 715d, a y-axis pulse converter 715e, a z-axis pulse converter 715f, and a rotation axis pulse converter 715g, which respectively convert the velocity values of the corresponding movement axes into pulse values and output the pulse values.

A driving unit includes the first, second, third and fourth x-axis driving parts 716a, 716b, 716c, and 716d, the y-axis driving part 716e, the z-axis driving part 716f, and the rotation axis driving part 716g, which receive the pulse values from the pulse converters 715a, 715b, 715c, 715d, 715e, 715f and 715g of the motion card 715, respectively.

Particularly, the first x-axis driving part 716a is received a pulse value from the first x-axis pulse converter 715a, the second x-axis driving part 716b is received a pulse value from the second x-axis pulse converter 715b, the third x-axis driving part 716c is received a pulse value from the third x-axis pulse converter 715c, the forth x-axis driving part 716d is received a pulse value from the forth x-axis pulse converter 715d. The respective x-axis driving parts 716a, 716b, 716c, and 716d amplify the pulse value received from the corresponding one of the first, second, third and fourth x-axis pulse converters 715a, 715b, 715c and 715d, and provide the amplified pulse values to the arm-driving part 210. The arm-driving part 210 adjusts horizontal movement velocities of the index arms 221, 222, 223, and 224 according to the pulse values received from the first, second, third and fourth x-axis driving parts 716a, 716b, 716c, and 716d.

The y-axis driving part 716e amplifies and provides the pulse value received from the y-axis pulse converter 715e and provides the amplified pulse value to the horizontal movement part 260. A horizontal movement velocity of the horizontal movement part 260 is adjusted according to the pulse value received from the y-axis driving part 716e.

The z-axis driving part 716f amplifies the pulse value received from the z-axis pulse converter 715f and provides the amplified pulse value to the vertical movement part 250. A vertical movement velocity of the vertical movement part 250 is adjusted according to the pulse value received from the z-axis driving part 716f.

The rotation axis driving part 716g amplifies the pulse value received from the rotation pulse converter 715g and provides the amplified pulse value to the rotation part 240. A rotation velocity and a rotation angle of the rotation part 240 are adjusted according to the pulse value received from the rotation axis driving part 716g.

Hereinafter, a process of making at least two of the index arms 221, 222, 223, and 224 of the index robot 200 simultaneously arrive at the target points will now be described in detail with reference to the accompanying drawing. Particularly, a process of simultaneously driving the first and second index arms 224 and 223, which are unload index arms, will be exemplified.

FIG. 6 is a flowchart illustrating a process that the first control unit 710 illustrated in FIG. 5 controls the horizontal movements of the first and second index arms 224 and 223.

Referring to FIGS. 2, 5 and 6, in operation S110, the input process part 711 receives the transfer informations including the velocity values of the respective movement axes of the index robot 200, and the position informations about the target points where the first and second index arms 224 and 223 will load or unload wafers.

In operation S120, the data register 712 stores the transfer information.

In operation S130, the comparison operation part 713 compares the expectation velocity profile of the first index arm 224 with the expectation velocity profile of the second index arm 223, and then carries out an operation the expectation velocity profile of the first index arm 224 with the second index arm 223 reference profile to reset the velocity values of the first and second index arms 224 and 223 such that the time points when the first and second index arms 224 and 223 arrive at the corresponding respective target points are the same. In operation S130, the comparison operation part 713 sets any one of the expectation velocity profiles of the first and second index arms 224 and 224 at the reference profile, however, the comparison operation part 713 may set the preset velocity profile at the reference profile.

In operation S140, the comparison operation part 713 outputs the velocity values reset in operation S130 and the velocity values of the rotation part 240, the vertical movement part 250, and the horizontal movement part 260.

In operation S150, the motion card 715 converts the velocity values output from the comparison operation part 713 into the pulse values, and outputs the pulse values to the driving parts 716a, 716b, 716c, 716d, 716e, 716f, and 716g.

In operation S160, the driving parts 716a, 716b, 716c, 716d, 716e, 716f, and 716g amplify and provide the received pulse values to the index robot 200.

In operation S170, the index robot 200 moves to a target point at a velocity set by the first control unit 710, and the first and second index arms 224 and 223 horizontally move at velocities adjusted by the first control unit 710 and simultaneously arrive at the different target points.

Since the process that the first control unit 710 adjusts the position and the velocity of the index robot 200 in this embodiment is the same as a process that the second control unit 720 adjusts the position and the velocity of the main transfer robot 500, the process that the second control unit 720 adjusts the position of the main transfer robot 500 will be omitted.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

The invention claimed is:

1. A substrate-processing apparatus comprising:
  a storage member arranging a plurality of substrates in a vertical direction to store the substrates;
  a transfer member including a plurality of transfer arms facing each other in the vertical direction, and an arm-driving part disposed under the transfer arms and coupled to the transfer arms and moving the respective transfer arms horizontally, the substrates being loaded on the respective transfer arms, the transfer member taking out and loading at least one substrate from and to the storage member; and
  a control unit controlling a movement velocity and a position of the transfer member and controlling the arm-driving part such that at least two of the transfer arms simultaneously arrive at target points in the storage member,
  wherein the control unit compares expectation velocity profiles corresponding to the target points of the respective transfer arms to be simultaneously controlled, so as to control movement velocities of the respective transfer arms.

2. The substrate-processing apparatus of claim 1, wherein the transfer member comprises:
  a rotation part disposed under the arm-driving part and coupled to the arm-driving part and rotating the arm-driving part;
  a vertical movement part disposed under the rotation part and coupled to the rotation part and moving the rotation part upward and downward to adjust vertical positions of the transfer arms; and
  a horizontal movement part disposed under the vertical movement part and coupled to the vertical movement part and moving horizontally to adjust a horizontal position of the transfer member.

3. The substrate-processing apparatus of claim 2, wherein the control unit comprises:
  an input process part receiving and outputting velocity information including respective velocity values of the transfer arms, the rotation part, the vertical movement part, and the horizontal movement part, and position information about the respective target points of the transfer arms;
  a comparison operation part calculating the expectation velocity profiles of the respective transfer arms based on the velocity information and the position information received from the input process part and comparing the expectation velocity profiles of the transfer arms with a preset reference profile to reset the respective velocity values corresponding to the index arms and outputting the reset velocity values;
  an output control part outputting the velocity values of the transfer arms output from the comparison operation part, and the respective velocity values corresponding to the rotation part, the vertical movement part, and the horizontal movement part;
  a motion card converting the respective velocity values corresponding to the transfer arms, the rotation part, the vertical movement part, and the horizontal movement part and output from the output control part, into pulse values, respectively, and outputting the converted pulse values; and
  a driving unit amplifying the pulse values outputted from the motion card and providing the amplified pulse values to the transfer member.

4. The substrate-processing apparatus of claim 3, wherein the comparison operation part, after respectively comparing the calculated expectation velocity profiles with the reference profile, respectively adjusts the expectation velocity profiles to reset the velocity values corresponding to the respective transfer arms such that at least two of the transfer arms arrives at the respective target points at a same time point.

5. A substrate-processing apparatus comprising:
a storage container spacing substrates to be processed or processed substrates in a vertical direction to store the substrates;
a buffer unit spacing the substrates to be processed and the processed substrates in the vertical direction to store the substrates;
an index robot including a plurality of index arms facing each other in the vertical direction, and an arm-driving part disposed under the index arms and coupled to the index arms and moving the respective index arms horizontally, the substrates being loaded on the respective index arms, the index robot transferring the substrate between the storage container and the buffer unit, the index robot taking out and loading at least one substrate from and to the storage container or the buffer unit; and
a first control unit controlling a movement velocity and a position of the index robot and controlling the arm-driving part such that at least two of the index arms simultaneously arrive at target points in the storage container or the buffer unit, wherein the first control unit compares expectation velocity profiles of the index arms to be simultaneously controlled, so as to control movement velocities of the respective index arms.

6. The substrate-processing apparatus of claim 5, further comprising:
a process chamber where the substrate is processed;
a main transfer robot including a plurality of pick-up hands facing each other in the vertical direction, and a hand-driving part moving the respective pick-up hands horizontally, the substrates being loaded on the respective pick-up hands, the main transfer robot transferring the substrate between the process chamber and the buffer unit, the main transfer robot taking out and loading at least one substrate from and to the buffer unit; and
a second control unit controlling a movement velocity and a position of the main transfer robot and controlling the hand-driving part such that at least two of the pick-up hands simultaneously arrive target points in the buffer unit,
wherein the second control unit compares expectation velocity profiles of the pick-up hands to be simultaneously controlled, so as to control movement velocities of the respective pick-up hands.

7. A substrate-processing apparatus comprising:
a storage member arranging a plurality of substrates in a vertical direction to store the substrates;
a transfer member taking out and loading at least one substrate from and to the storage member; and
a control unit controlling a movement velocity and a position of the transfer member,
wherein the transfer member comprises:
a plurality of transfer arms facing each other in the vertical direction;
an arm-driving part disposed under the transfer arms and coupled to the transfer arms and moving the respective transfer arms horizontally, the substrates being loaded on the respective transfer arms;
a rotation part disposed under the arm-driving part and coupled to the arm-driving part and rotating the arm-driving part;
a vertical movement part disposed under the rotation part and coupled to the rotation part and moving the rotation part upward and downward to adjust vertical positions of the transfer arms; and
a horizontal movement part disposed under the vertical movement part and coupled to the vertical movement part and moving horizontally to adjust a horizontal position of the transfer member.

* * * * *